United States Patent [19]
Kim

[11] Patent Number: 5,612,696
[45] Date of Patent: Mar. 18, 1997

[54] DIGITAL-TO-ANALOG CONVERTER OF CURRENT SEGMENTATION

[75] Inventor: Ook Kim, Seoul, Rep. of Korea

[73] Assignee: Electronics & Telecommunications Research Institute, Daejeon, Rep. of Korea

[21] Appl. No.: 359,204

[22] Filed: Dec. 19, 1994

[30]    Foreign Application Priority Data

Dec. 3, 1994  [KR]  Rep. of Korea ............ 94-32660

[51] Int. Cl.$^6$ ..................................... H03M 1/66
[52] U.S. Cl. .................. 341/136; 341/144; 341/118
[58] Field of Search ................................. 341/118, 120, 341/121, 136, 144

[56]            References Cited

U.S. PATENT DOCUMENTS

| | | | |
|---|---|---|---|
| 4,138,671 | 2/1979 | Comer et al. ............................ | 341/121 |
| 4,523,182 | 6/1985 | Harvey et al. ........................... | 341/121 |
| 4,725,813 | 2/1988 | Miyada .................................... | 341/136 |
| 4,967,197 | 10/1990 | Peng ........................................ | 341/118 |
| 5,008,671 | 4/1991 | Tuthill .................................... | 341/136 |
| 5,212,484 | 5/1993 | Hillis ...................................... | 341/154 |
| 5,258,757 | 11/1993 | Reynolds .............................. | 341/136 |
| 5,293,166 | 3/1994 | Ta ........................................... | 341/118 |
| 5,446,457 | 8/1995 | Ryat ........................................ | 341/136 |

*Primary Examiner*—Marc S. Hoff
*Attorney, Agent, or Firm*—Antonelli, Terry, Stout & Kraus, LLP

[57]            ABSTRACT

A digital-to-analog (D/A) converter of current segmentation is disclosed. A plurality of current sources are connected in parallel to one another and connected to a load resistance through a plurality of first switches. A second switch is connected in parallel to the first switches and operates oppositely to the first switches. An output impedance compensation resistance is connected in series to the second switch.

10 Claims, 5 Drawing Sheets

DIGITAL-TO-ANALOG CONVERTER OF CURRENT SEGMENTATION

BACKGROUND OF THE INVENTION

1. Field of the Invention

The present invention relates to digital-to-analog converters, and more particularly to a digital-to-analog converter of a current segmentation type.

2. Description of the Prior Art

A general current output digital-to-analog (D/A) converter obtains a desired analog current by the combination of a plurality of current sources. FIG. 1 illustrates such a current output D/A converter. As shown, an analog output current $I_{out}$ is determined by the combination of current sources $I_1, I_2, \ldots I_N$. An output voltage $V_{out}$ across both terminals of an output resistance $R_{out}$ is equal to a multiplication of the output resistance and output current as represented by the following:

$$V_{out} = I_{out} \cdot R_{out} \tag{1}$$

Actually, each current source has a finite output resistance as shown in FIG. 2. The output resistance varies with the state of a current switch. If the current source is connected to an output terminal by the switch, i.e. during the ON state, a resistance $R_I$ of the current source appears as an equivalent resistance at the output terminal. If the current source is separated from the output terminal, i.e. during the OFF state, the equivalent resistance has an infinite value. Accordingly, it will be readily appreciated that the equivalent resistance at the output terminal varies with the state of the current switch. When k switches are in the ON state, the equivalent resistance $R_{OUT}^{TOTAL}(K)$ seen from the output terminal is given by:

$$R_{OUT}^{TOTAL}(k) = \left( \sum_{i=1}^{k} 1/R_{OUT}^i \right)^{-1} \tag{2}$$

where $R_{out}^i$ is the output impedance of the i-th current source.

The output current $I_{out}$ is determined by:

$$I_{OUT} = \frac{R_{OUT}^{TOTAL}(k)}{R_{OUT}^{TOTAL}(k) + R_L} \cdot \sum_{i=1}^{K} I_i \tag{3}$$

where $I_i$ is the output current of the i-th current source.

If $R_{OUT}^{TOTAL}(K) R_L$, the equation (3) can be represented by the following equation (4) to maintain the linear relationship between the output current and an input code, and otherwise linearity deviates from an ideal value.

$$I_{OUT} \approx \sum_{i=1}^{k} I_i \tag{4}$$

However, a conventional D/A converter uses a cascode arrangement, or an additional transistor with a long length to achieve high impedance for satisfying the equation (4). The former has a disadvantage in that a voltage operation of an additional transistor is difficult. The latter increases the size of the transistor to unnecessarily consume power and lower the speed of the device, due to an increased parasitic capacitance. A variation in the equivalent resistance results in a nonlinearity between an input digital code and analog output current. Consequently, the integral nonlinearity (INL) of the D/A converter is increased. This disadvantage causes a serious problem with an increase in the number of bits of the D/A converter.

A general process for overcoming this problem is to reduce an effect upon the output current by considerably increasing the output resistance during the ON state of each current source. In order to increase the output resistance of each current source, the size of the device is increased, or a circuit for increasing the output resistance is used. The former increases the total size of the devices and lowers the speed of the device due to the parasitic capacitance. The latter is difficult to use with a low supply voltage.

SUMMARY OF THE INVENTION

It is an object of the invention to provide a D/A converter which is operable at a low supply voltage and has a small area by providing compensation for the output resistance.

In accordance with one aspect of the invention, a plurality of current sources are connected in parallel to one another and connected to a load resistance through a plurality of first switch. A second switch is connected in parallel to the first switch and operates oppositely to the first switch. An output impedance compensation resistance is connected in series to the second switch.

BRIEF DESCRIPTION OF THE DRAWINGS

For a better understanding of the invention and to show how the same may be carried into effect, reference will now be made, by way of example only, to the attached drawings, in which.

DETAILED DESCRIPTION OF THE PREFERRED EMBODIMENT

Figure 1:
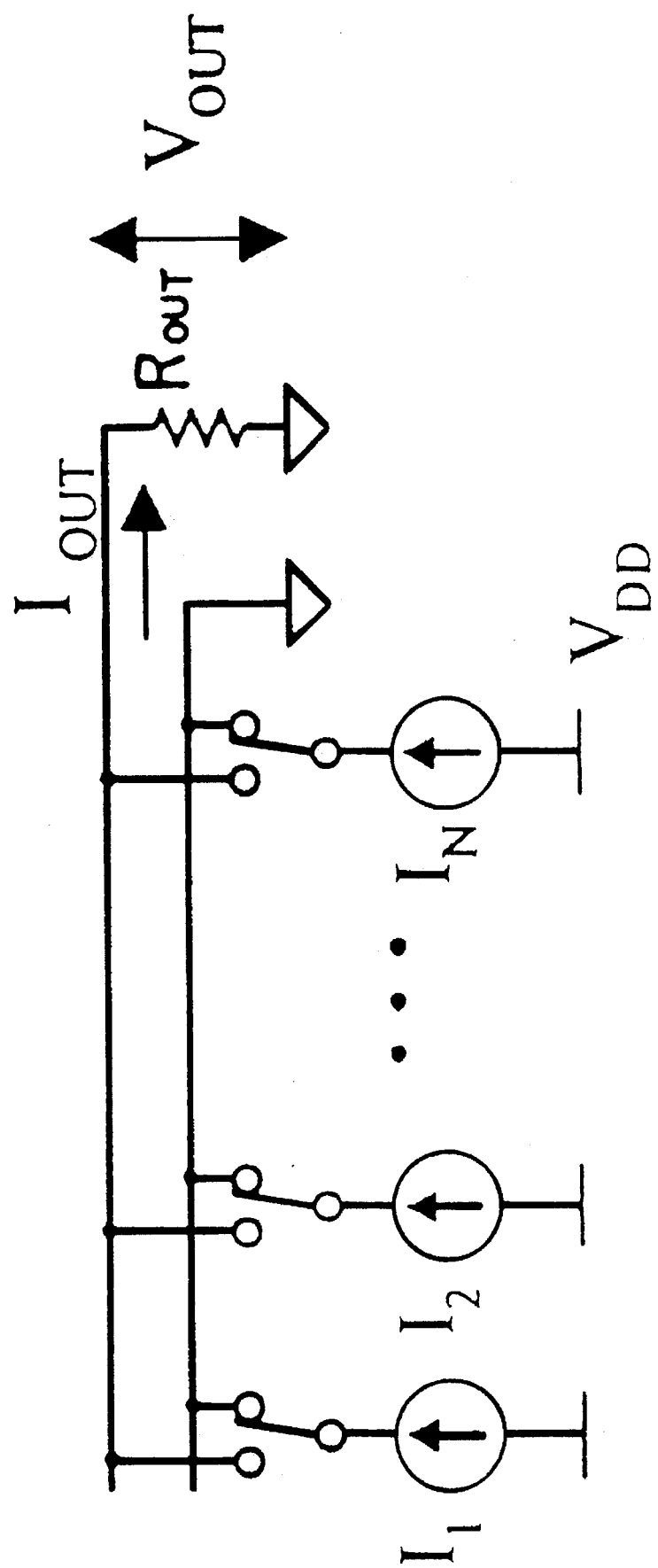
FIG. 1 is a circuit diagram of a general current output D/A converter.
Figure 3:
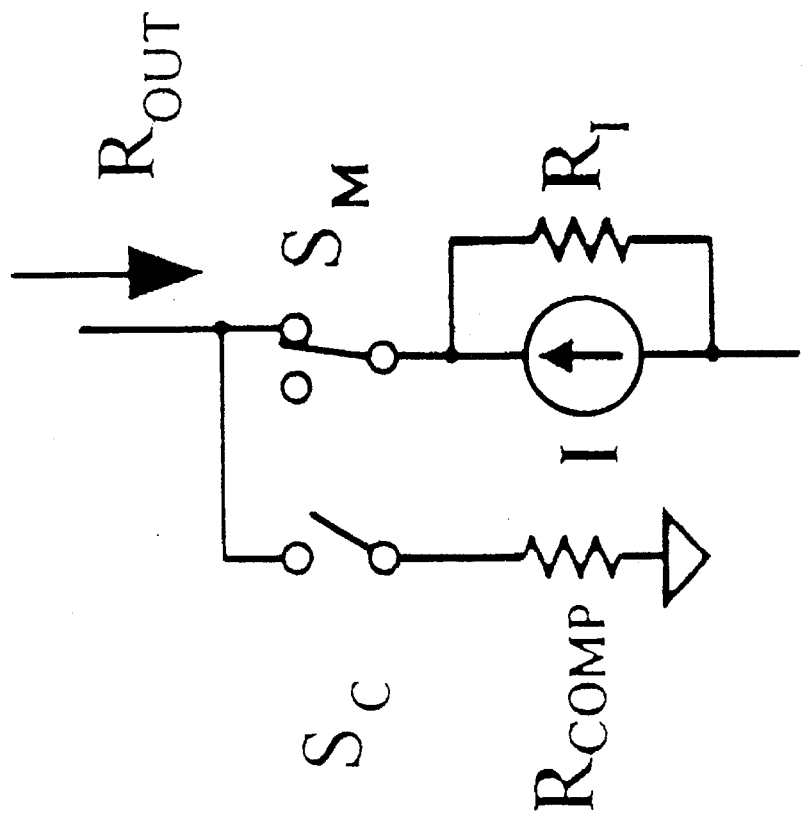
FIG. 3 is an equivalent circuit diagram of a current source having an output resistance compensating circuit according to the present invention.
Figure 2:
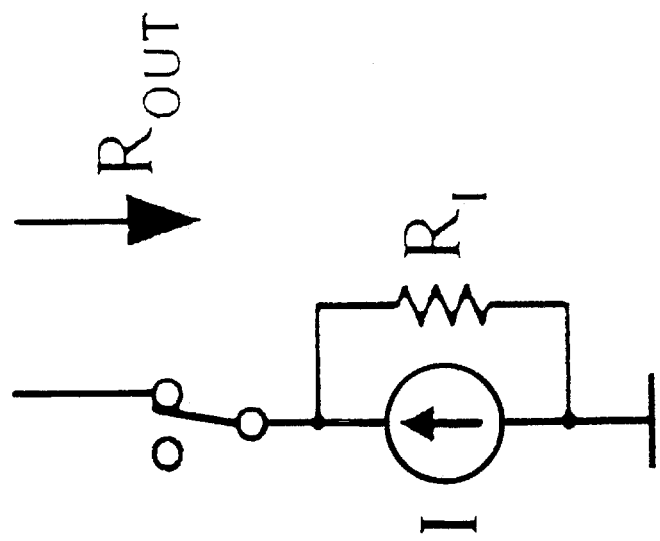
FIG. 2 is an equivalent circuit diagram of a current source of FIG. 1.

Referring to FIG. 3, an additional switch connected to a current switch is used. A output resistance compensating circuit comprises a compensation switch $S_c$ and a compensation resistance The compensation switch $S_c$ operates oppositely to the main switch $S_M$. Output resistances $R_{OUT}^{on}$ and $R_{OUT}^{off}$ seen from an output terminal output terminal for a combination of a current switch and a compensation circuit during the ON/OFF state are given by the following equations (5) and (6), respectively:

$$R_{OUT}^{on} \approx R_I \tag{5s}$$

$$R_{OUT}^{off} \approx R_{COMP} \tag{6}$$

When setting the compensation resistance $R_{COMP}$ so as to satisfy the following equation (7), the output resistance has a constant value irrespective of the ON/OFF state and the equation (3) is given by the following equation (8) to ensure linearity.

$$R_I = R_{COMP} \tag{7}$$

$$I_{OUT} = \frac{R_{OUT}^{TOTAL}(k)}{R_{OUT}^{TOTAL}(k) + R_L} \cdot \sum_{i=1}^{k} I_i \approx \frac{R_I}{R_I + N \cdot R_L} \cdot \sum_{i=1}^{k} I_i \propto \sum_{i=1}^{k} I_i \tag{8}$$

Figure 4:
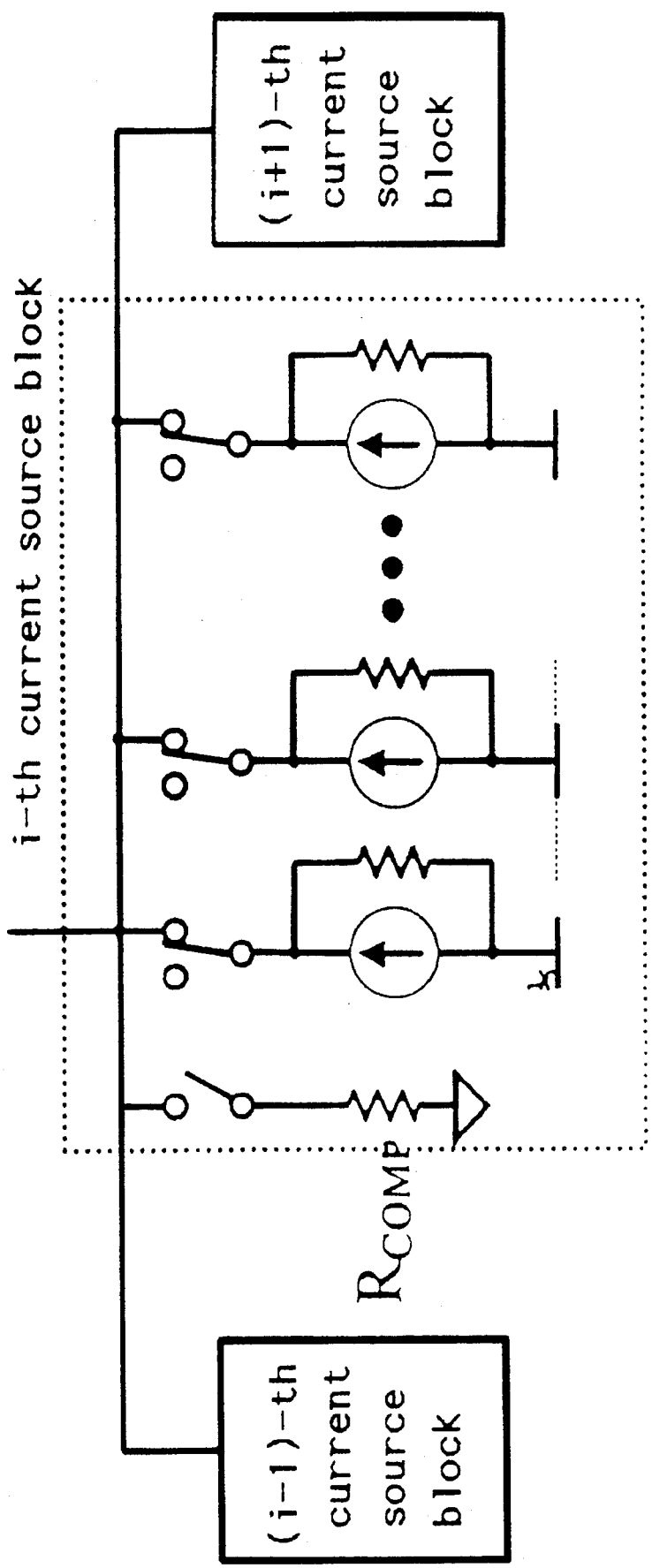
FIG. 4 is a circuit diagram showing a current source arrangement sharing an output resistance compensating circuit according to the present invention.

FIG. 4 shows an i-th current source block sharing the output resistance compensating circuit. One compensation resistance $R_{COMP}$ is shared by a plurality of switches. Generally, since the amount of compensation is very small in comparison to the total accuracy, especially in a unit current switch, a plurality of current switches are grouped so as to be compensated by one compensation resistance.

Figure 5:
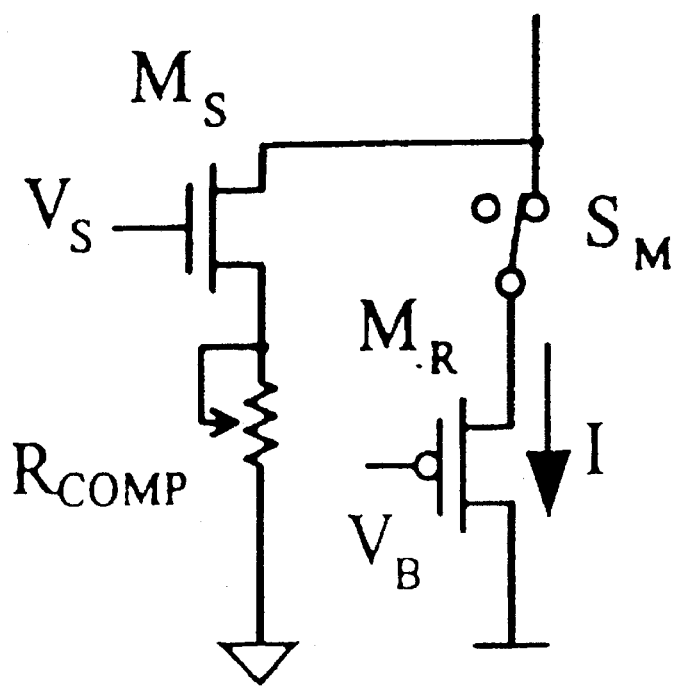
FIG. 5 is an equivalent circuit diagram of a current source having an output resistance compensating circuit with a MOS transistor according to the present invention.
Figure 6:
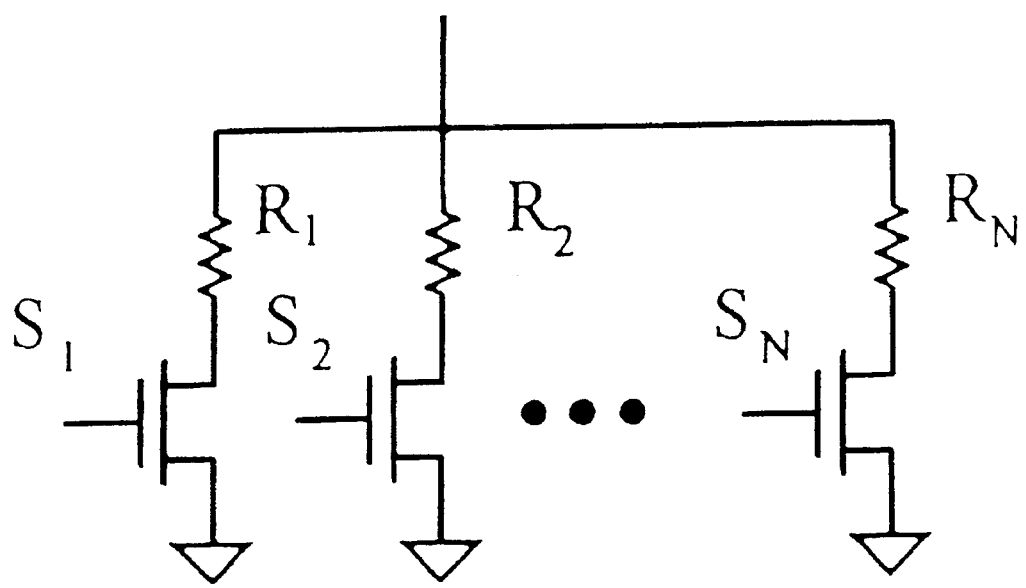
FIG. 6 is a circuit diagram showing an example for adjusting a resistance of an output resistance compensating circuit according to the present invention.

FIG. 5 shows the current source constructed with a PMOS transistor $M_R$. The main switch $S_M$ is a general current switch. A switch for connecting and separating the compensation resistance $R_{COMP}$ is constructed with a transistor $M_S$ operated in a linear region. The transistor $M_S$ is turned on and off by a voltage $V_S$ applied to its gate electrode. To satisfy the above equation (7) which is an ideal compensation condition, the compensation resistance $R_{COMP}$ is of a variable resistance. To construct the variable resistance, a plurality of resistances $R_1, \ldots, R_N$ are connected in parallel to one another and connected to a ground terminal through respective switches $S_1, \ldots, S_N$ as shown in FIG. 6. An optimal compensation resistance may be applied by an appropriate value after device fabrication or may be automatically set by inserting an additional measuring circuit in the D/A converter.

Figure 7:
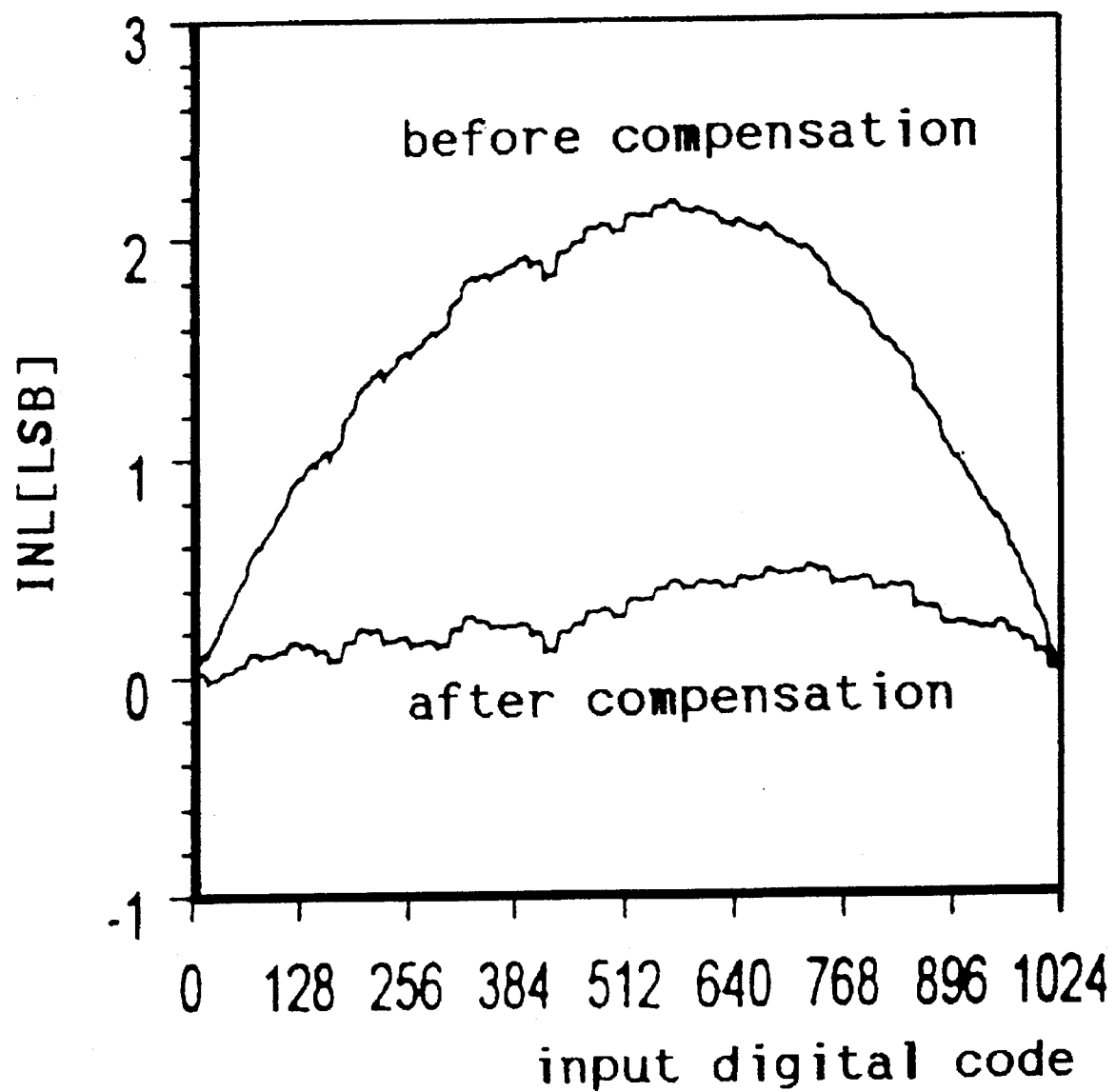
FIG. 7 is a graph showing integral nonlineartry (INL) of the inventive D/A converter and a conventional D/A converter.

FIG. 7 shows integral nonlinearity INL indicating the accuracy of an analog output value as a function of an input digital code and includes a random error of each current source. If the current source is not compensated by the D/A converter of 10 bits, INL values illustrate a curvilinear form. Meanwhile, if the output resistance compensation circuit is used, the INL values shows a linear structure. As estimated from the equation (3), a gradient of curvature is determined by a relative ratio of the output resistance of each current source and load resistance.

As described above, in order to improve the accuracy with respect to the same load resistance, when raising the output impedance by increasing the length of a MOS field effect transistor (MOS FET) used as the current source, the total size of the devices is increased, and the operating speed of the device is lowered by the parasitic capacitance. However, the D/A converter embodying the present invention can overcome such problems. Disadvantages generated in the case of increasing the output impedance of the current source through the cascode arrangement can be also overcome. Therefore, the high-speed operation and high resolution can be achieved by simplifying a current source structure. The operation at a low supply voltage is possible. Further, the inventive D/A converter requires low power consumption and may be broadly used in the D/A converter utilizing a CMOS.

While there is shown and described the preferred embodiment of invention, it will be understood by those skilled in the art that foregoing and other changes in form and details may be made without departing from the spirit and scope of the present invention.

What is claimed is:

1. A digital-to-analog converter comprising:

a plurality of current sources connected to an output resistance through a plurality of first switching means, said plurality of current sources being connected in parallel to one another;

at least one second switching means connected in parallel to said plurality of first switching means;

an output impedance compensation element connected in series to said second switching means; and said second switching means connecting said output impedance compensation element to the output resistor depending on a switching state of the said first switching means.

2. A digital-to-analog as claimed in claim 1 wherein:

said compensation element has a resistance related to an internal resistance of each of said plurality of current sources.

3. A digital-to-analog converter as claimed in claim 2 wherein:

said second switching means switches to decrease said internal resistance which is comprised of said second switching means and said output impedance compensation element as the output current switched by the first switching means increases.

4. A digital-to-analog converter as claimed in claim 1 wherein:

said second switching means is a transistor operated in a linear region.

5. A digital-to-analog converter as claimed in claim 1 wherein:

said plurality of current sources are respectively constructed with a PMOS field effect transistor.

6. A digital-to-analog converter as claimed in claim 1 wherein:

said compensation element is a variable resistance.

7. A digital-to-analog converter as claimed in claim 6 wherein:

said variable resistance is disconnected from the plurality of first switching means by a transistor comprising the second switching means.

8. A digital-to-analog converter as claimed in claim 6 wherein said variable resistor comprises:

a plurality of resistors connected in parallel to one another; and third switching means connected in series to said plurality of resistors respectively for varying a resistance of the variable resistor.

9. A digital-to-analog converter as claimed in claim 8 wherein:

said third switching means is a transistor operated in a linear region.

10. A digital-to-analog converter as claimed in claim 8 wherein:

said plurality of resistors are disconnected from the plurality of first switching means by using a transistor comprising the third switching means.

* * * * *